United States Patent
Rengarajan et al.

[11] Patent Number: 6,074,903
[45] Date of Patent: Jun. 13, 2000

[54] METHOD FOR FORMING ELECTRICAL ISOLATION FOR SEMICONDUCTOR DEVICES

[75] Inventors: Rajesh Rengarajan, Poughkeepsie; Hirofumi Inoue, Fishkill, both of N.Y.; Radhika Srinivasan, Mahwah, N.J.; Jochen Beintner, Wappingers Falls, N.Y.

[73] Assignees: Siemens Aktiengesellschaft, Munich, Germany; International Business Machines Corporation, Armonk, N.Y.; Kabushiki Kaisha Toshiba, Kanagawa-Ken, Japan

[21] Appl. No.: 09/098,203

[22] Filed: Jun. 16, 1998

[51] Int. Cl.[7] .................................................. H01L 21/8238
[52] U.S. Cl. .......................... 438/218; 438/400; 438/424
[58] Field of Search ..................................... 438/218, 221, 438/400, 424, 700; 257/905, 374, 499, 501, 506, 725

[56] References Cited

U.S. PATENT DOCUMENTS

| | | | |
|---|---|---|---|
| 4,571,819 | 2/1986 | Rogers et al. | 438/430 |
| 5,879,980 | 3/1999 | Selcuk et al. | 428/238 |
| 5,880,006 | 3/1999 | Lin et al. | 438/424 |

*Primary Examiner*—John F. Niebling
*Assistant Examiner*—Christopher Lattin
*Attorney, Agent, or Firm*—Stanton C. Braden

[57] ABSTRACT

A method for forming a electrically isolated semiconductor devices in a silicon body. A trench is formed in a selected region of the body. A barrier material is deposited over sidewalls of the trench. Portions of the barrier material are removed from a first sidewall portion of the trench to expose such first sidewall portion of the trench while leaving portions of such barrier material on a second sidewall portion of the trench to form a barrier layer thereon. A dielectric material is deposited in the trench, a portion of dielectric material being deposited on the exposed first sidewall portion of the trench and another portion of such deposited dielectric material being deposited on the barrier material. The dielectric material is annealed in an oxidizing environment to densify such deposited dielectric material, the barrier layer inhibiting oxidation of the said second sidewall portion of the trench. A plurality of the semiconductor devices is formed in the silicon body with such devices being electrically isolated by the dielectric material in the trench.

11 Claims, 4 Drawing Sheets

METHOD FOR FORMING ELECTRICAL ISOLATION FOR SEMICONDUCTOR DEVICES

BACKGROUND OF THE INVENTION

This invention relates generally to semiconductor devices to more particularly to semiconductor devices having shallow trench isolation.

As is known in the art, active devices formed in semiconductor integrated circuits are electrically isolated by a dielectric. One technique to isolate devices formed in a silicon substrate is to form silicon dioxide regions between the devices. One technique is sometimes referred to as a local oxidation (LOCOS) process wherein exposed areas of the silicon are oxidized to form field oxide region between the devices. In another technique, a so-called shallow trench isolation (STI) technique, shallow trenches are formed in the exposed areas of the silicon and are then filled with a dielectric, typically TEOS. Prior to filling the trenches, a thin layer of silicon dioxide is thermally grown over the surface including sidewalls of the trenches. Next, a thin layer is silicon nitride is chemically vapor deposited over the silicon dioxide. A layer of TEOS is then deposited over the silicon nitride, portions of the TEOS filling the trench. The structure then typically undergoes a wet anneal during densification of the TEOS. The silicon nitride layer is used to prevent oxygen produced during the wet anneal from entering the silicon. That is, the silicon nitride prevents oxidation of the silicon trench sidewalls; otherwise, such oxidation would tend to create unwanted stresses and crystal dislocations in the silicon. The upper portions of the TEOS are removed to expose the portions of the surface of the silicon adjacent to STI region. The surface of the silicon is oxidized to form a gate oxide. Doped polycrystalline silicon is then formed over the gate oxide and photolithographically patterned into gate electrodes for MOSFET devices being formed.

As is also known in the art, some integrated circuits use both p-channel on n-channel MOSFETs. For example, in a DRAM, an array of memory cells is provided in one region of the circuit and auxiliary circuitry, such as addressing and logic circuitry, are formed in another region of the circuit, for example around the periphery of the array region. One type of DRAM cell includes a MOSFET connected to a buried, or trench capacitor. As noted above, absent the nitride liner along the sidewalls of the STI trench, the silicon sidewalls of the trench may become oxidized during the wet anneal used to densify the TEOS. This oxidation will cause stresses and dislocations in the silicon thereby reducing charge retention time by the DRAM cell, Thus, a silicon nitride layer is formed on the isolation trench sidewalls to protect the silicon sidewalls. Further, while the MOSFETs used in the array may be n-FET devices, the auxiliary circuits may include p-FET devices. Still further, in order to use the same type doping for the polycrystalline silicon used for both the p-MOSFETs and n-MOSFETs while both type MOSFET have substantially the same work function, a buried channel MOSFET is used for the p-MOSFET devices.

SUMMARY OF THE INVENTION

In accordance with the invention, a method is provided for forming electrically isolated semiconductor devices in a silicon body. A trench is formed in a selected region of the body. A barrier material is deposited over sidewalls of the trench. Portions of the barrier material are removed from a first sidewall portion of the trench to expose such first sidewall portion of the trench while leaving portions of such barrier material on a second sidewall portion of the trench to form a barrier layer thereon. A dielectric material is deposited in the trench, a portion of dielectric material being deposited on the exposed first sidewall portion of the trench and another portion of such deposited dielectric material being deposited on the barrier material. The dielectric material is annealed in an oxidizing environment to densify such deposited dielectric material, the barrier layer inhibiting oxidation of the said second sidewall portion of the trench. A plurality of the semiconductor devices is formed in the silicon body with such devices being electrically isolated by the dielectric material in the trench.

In accordance with another feature of the invention, the step of forming the active devices comprises forming one of the active devices as a p-MOSFET and forming another one of the active devices as a n-MOSFET.

In accordance with another feature of the invention, the forming step comprises forming one of the devices as a buried channel device.

In accordance with another feature of the invention the step of forming the active devices comprises forming one of the active devices as a buried channel device adjacent to the first sidewall portion of the trench.

In accordance with another feature of the invention, the step of forming the barrier material comprises forming a barrier material of silicon nitride.

In accordance with still another feature of the invention, a semiconductor structure is provided having a trench disposed in a silicon body. The trench has sidewall portions. A barrier material is disposed on a second one of the sidewall portions to provide a barrier material lined sidewall portion of the trench. A first one of the sidewall portions is un-coated with the barrier material. A dielectric material is disposed in the trench. One portion of the dielectric material is in contact with the barrier material coated second one of the sidewall portions of the trench and another portion of the dielectric material is in contact with the first one of the sidewall portions of the trench. A pair of active devices is disposed in the silicon body, such devices being electrically isolated by the dielectric material in the trench.

In accordance with another feature of the invention, one of the active devices is a p-MOSFET and another one of the active devices is a n-MOSFET.

In accordance with another feature of the invention, one of the devices is a buried channel device.

In accordance with another feature of the invention, one of the active devices the buried channel device is disposed adjacent to the first one of the sidewall portions of the trench.

BRIEF DESCRIPTION OF THE DRAWING

Other features of the invention, as well as the invention itself, will become more readily apparent when taken together with the accompanying drawings, in which.

DESCRIPTION OF THE PREFERRED EMBODIMENTS

Figure 1A:
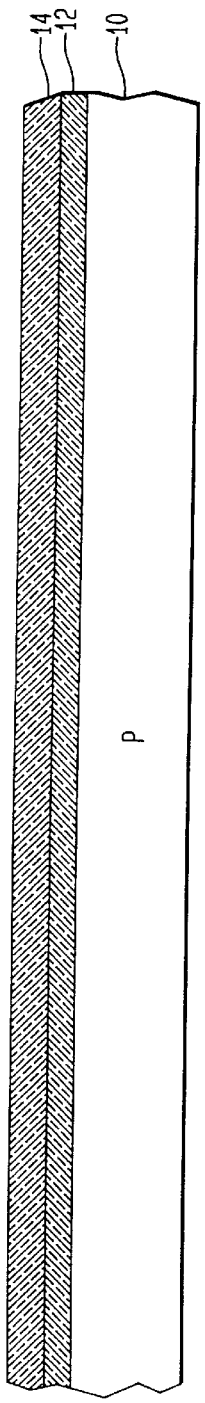
FIGS. 1A–1I are diagrammatical cross sectional sketches of electrically isolated MOSFETs at various stages in the fabrication thereof in accordance with the invention.

Referring now to FIG. 1A, a semiconductor body or substrate 10, here p-type conductivity silicon, is shown. A layer 12 of silicon dioxide is thermally grown over the upper surface of the substrate 10, here to a thickness in the range of 50 A. Next, a layer 14 of silicon nitride is deposited, here by chemical vapor deposition (CVD) to a thickness of here in the range of 2500 A on the silicon dioxide layer 14, as shown.

Figure 1B:
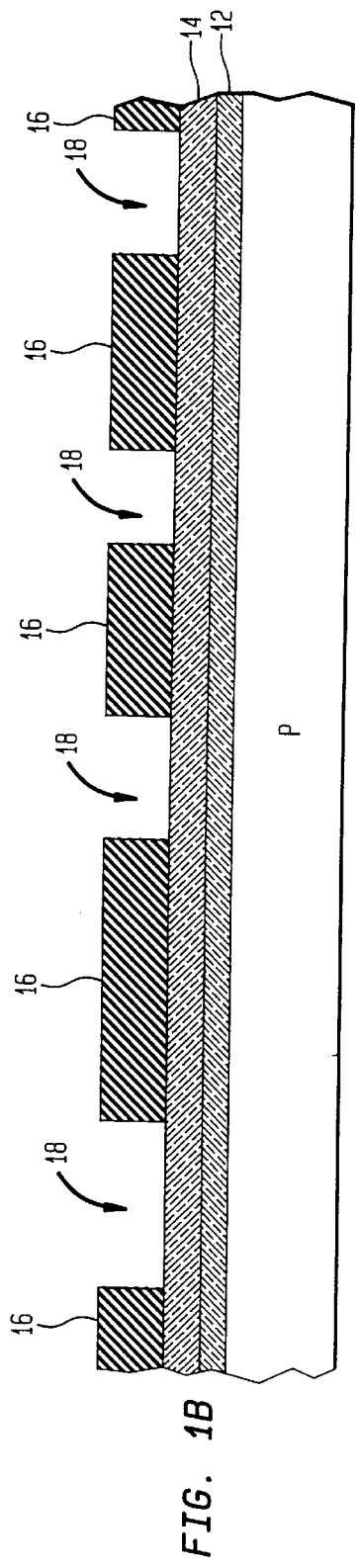
Figure 1C:
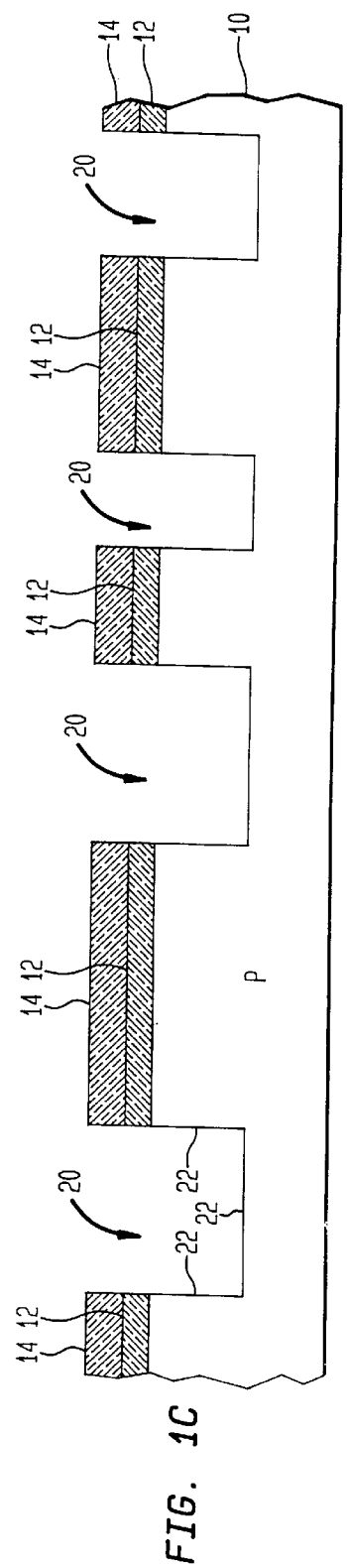

Referring now to FIG. 1B, a photoresist layer 16 of photoresist is deposited on the layer 14 of silicon nitride and photolithographically patterned, as shown, to have windows 18 formed therein over the regions of the substrate 10 where trenches for the STI are to be formed. Thus, the photoresist layer 16 is patterned to provide an etch mask, as shown in FIG. 1B. The structure is then exposed to an etch, here a dry etch, to first remove the portions of the silicon nitride layer 14 exposed by the windows 18. The photoresist layer 16 is stripped. Next, using the patterned silicon nitride layer 14 as an etch mask, the exposed, underlying portions of the silicon dioxide layer 12 are removed by here a dry etch thereby exposing underlying portions of the surface of the silicon substrate 10. Next, the exposed portions of the silicon are etched, here using a dry etch, to form trenches 20 is the silicon substrate 10 surface as shown in FIG. 1C.

Figure 1D:
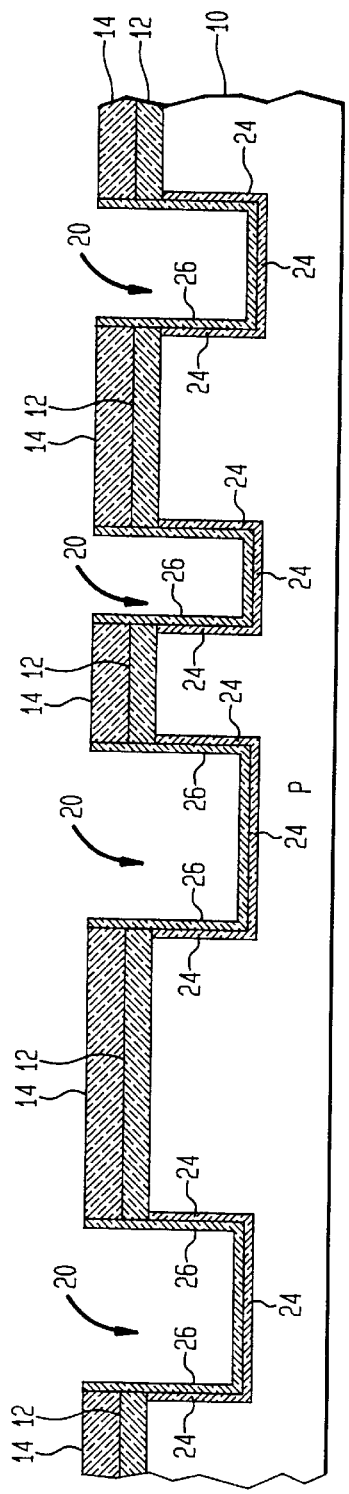

Referring now to FIG. 1D, a thin layer 24, here 100 A thick, of silicon dioxide is thermally grown over the walls 22 (FIG. 1C) of the trenches 20. Next, a barrier material, here a liner, or layer 26 of silicon nitride is deposited over the structure. Here, the silicon nitride layer 26 is deposited by chemical vapor deposition to a thickness in the range of 60 A.

Figure 1E:
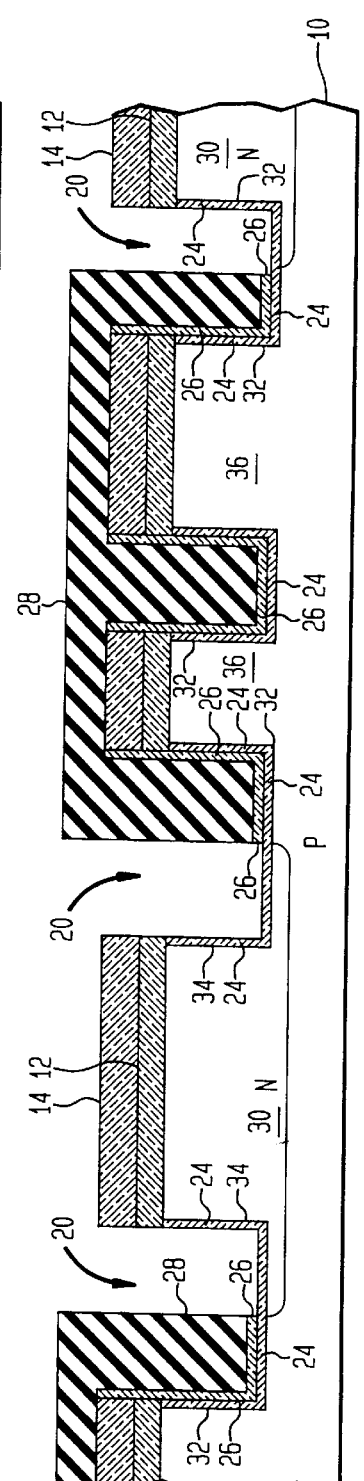

Referring now to FIG. 1E, a photoresist layer 28 is deposited over the surface of the structure and photolithographically patterned, as shown to provide a mask. It is noted that the mask provided by the photoresist layer 28 exposes the regions in the p-type conductivity substrate 10 where n-type conductivity wells 30 are to be formed. It is also noted that the mask provided by the photoresist layer 28 is disposed over sidewall portions 32 of the trenches 20 while such mask has apertures to expose different, sidewall portions 34 of the trench 20. More particularly, the patterned photoresist layer 28 expose the sidewall portions 34 which are disposed about the periphery of the n-type conductivity wells 30, for reasons to become apparent. Suffice it to say here, however, the n-type conductivity wells 30 will have formed therein p-channel MOSFET devices while the regions 36 in the p-type conductive substrate 10 electrically isolated by the trenches 20 will have formed therein n-channel MOSFET devices.

After patterning the photoresist layer 28 as shown in FIG. 1E, a etch, here a dry etch, is brought into contact with the structure to remove portions of the silicon nitride layer 26 exposed by the apertures in the photoresist layer 28, as shown in FIG. 1E. It is noted that the etch removes the portions of the silicon nitride layer 26 disposed on the trench 20 sidewall portions 34 while the portions of the silicon nitride layer 26 disposed on the trench 20 sidewall portions 32 remain. It is also noted that portions of the silicon nitride layer 26 on the bottom of the trenches 20 exposed by the patterned photoresist layer 28 are also removed while portions of the silicon nitride layer 26 on the bottom of the trenches 20 covered by the patterned photoresist layer 28 also remain.

Next, a suitable n-type conductivity dopant, here phosphorus, is ion implanted or diffused into the portions of the silicon exposed by the patterned photoresist layer 28 to thereby provide the n-type conductivity wells 30, as shown in FIG. 1E.

Figure 1F:
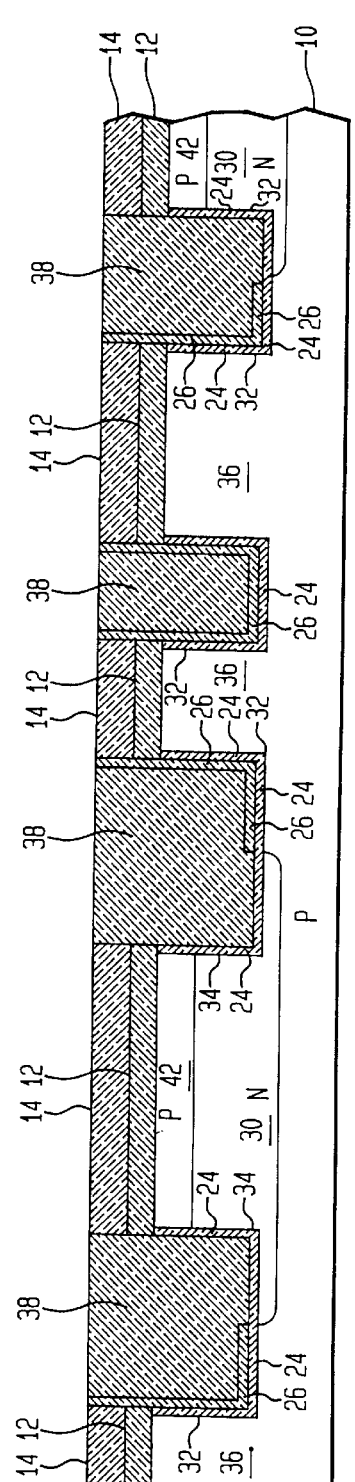

Next, referring also to FIG. 1F, the photoresist layer 28 is stripped away. Next, a silicon dioxide dielectric material 38, here TEOS is deposited over the surface of the structure, portions of such TEOS being deposited in the trenches 20, as shown in FIG. 1F, portion of the material 38, not shown, extending over the silicon nitride layer 14. The structure undergoes a wet anneal during densification of the TEOS material 38. The silicon nitride layer 26 is used to prevent oxygen produced during the wet anneal from entering the portions of the silicon substrate 10 where the n-channel MOSFET devices are to be formed, i.e., the regions 36. That is, the silicon nitride layer 26 prevents oxidation of the silicon trench sidewalls; otherwise, such oxidation would tend to create unwanted stresses and crystal dislocations in the silicon substrate 10. That is, the dielectric material 38 is annealed in an oxidizing environment to densify such deposited dielectric material 38 while the barrier silicon nitride layer 26 inhibits oxidation of the sidewall portions 32 of the trenches 20. It is noted, however, that the sidewall portions 34 disposed about the periphery n-type conductivity wells 30 (i.e, the regions where the p-channel MOSFETs will be formed) do not have the silicon nitride layer 26 thereby eliminating a source of electrons which interfere with the p-channel MOSFETs. The upper portions, not shown, of the TEOS material 38 are removed here by chemical mechanical polishing (CMP) to form the structure shown in FIG. 1F.

Next, the surface of the structure is masked by a photoresist mask, not shown, having windows therein to expose the N-well regions 30 and a p-type conductivity dopant ions, here boron, are implanted through the exposed portions of the silicon nitride layer 14 and silicon dioxide layer 12 to form, after an ion activation anneal, p-type conductivity buried channel regions 42 in the n-type conductivity wells 30, as shown in FIG. 1F.

Figure 1G:
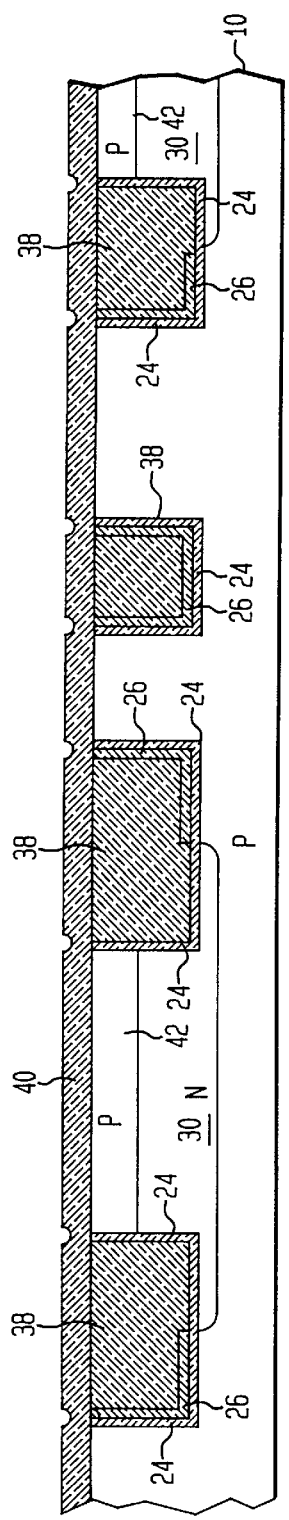
Figure 1H:
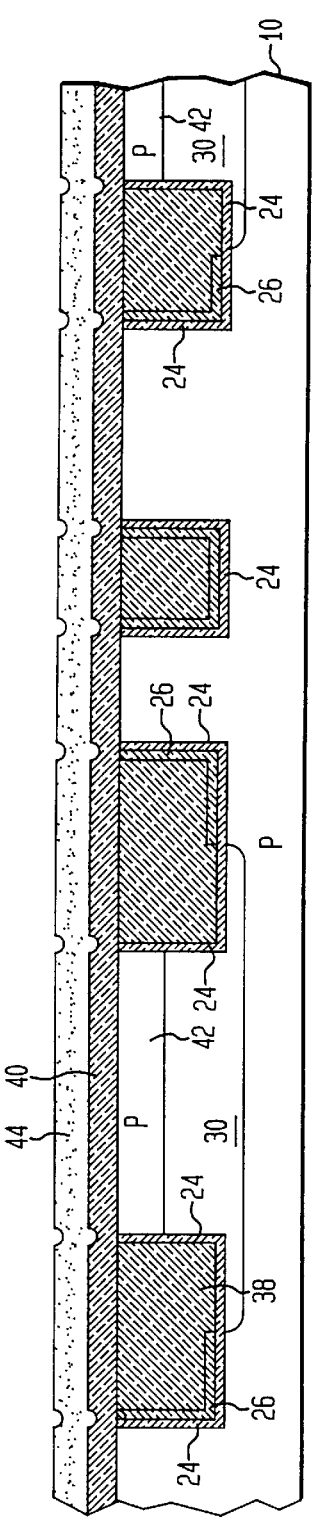
Figure 1I:
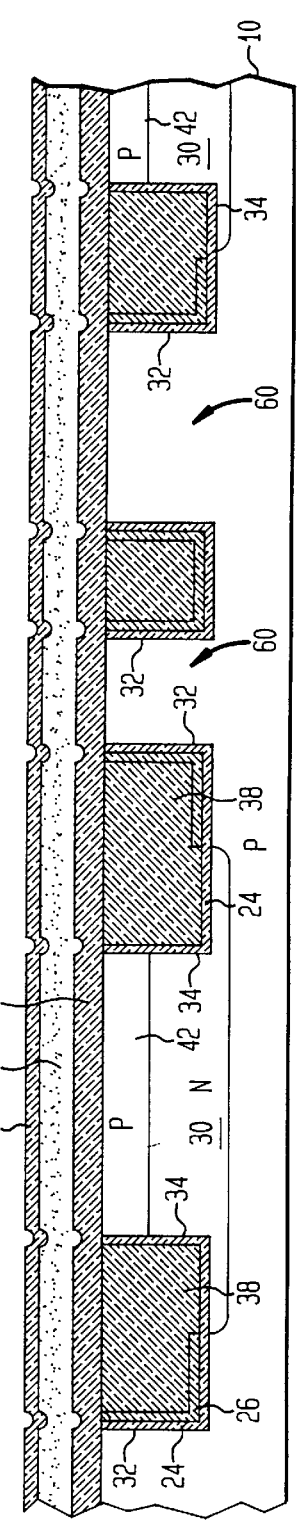
Figure 2:
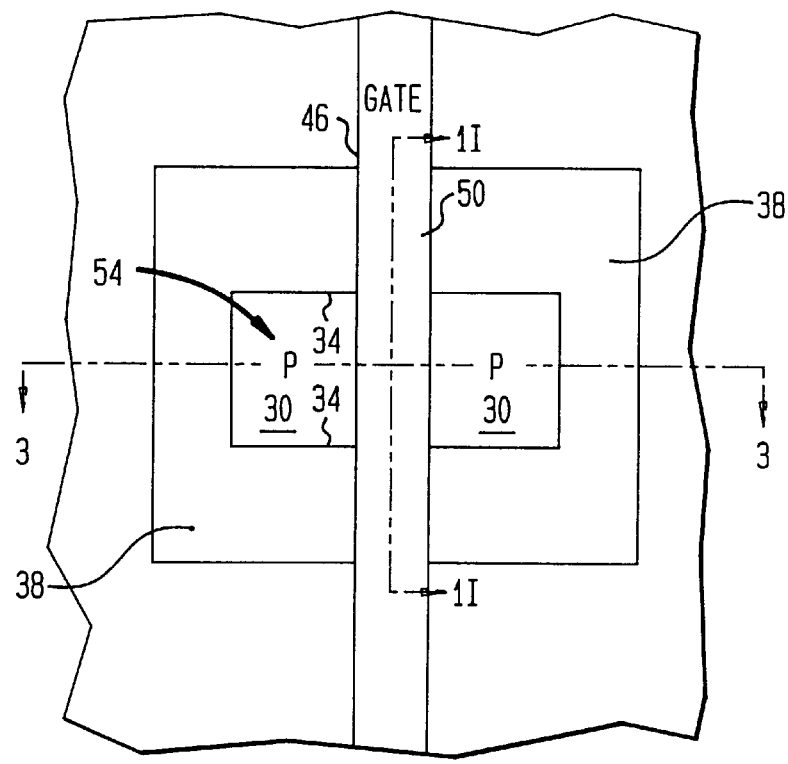
FIG. 2 is a plan view sketch of one of the MOSFETs shown in FIG. 1I, the cross sectional view of such MOSFET in FIG. 1I being taken along line 1I—1I in FIG. 2.
Figure 3:
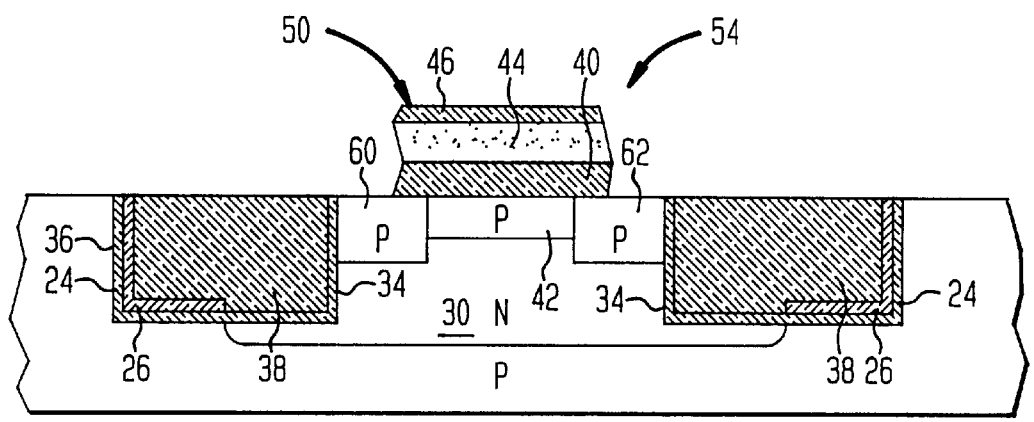
FIG. 3 is a cross sectional sketch of the MOSFET shown in FIG. 2, such cross section being taken along line 3—3 in FIG. 2.

Next, the silicon nitride layer 14 and the silicon dioxide layer 12 are removed, here by a wet etch, thereby exposing the surface portions of the silicon substrate 10. Next, referring to FIG. 1G, a layer 40 of silicon dioxide is thermally grown into the exposed surface portions of the silicon substrate 10, as shown. Next, a layer 44 of n$^+$type conductivity doped polycrystalline silicon is deposited over the silicon dioxide layer 44, as shown in FIG. 1H. Next, an electrically conductive layer 46, here aluminum, is deposited over the polycrystalline silicon layer 44, as shown in FIG. 1I. The silicon dioxide layer 40, doped polycrystalline silicon layer 44, and electrically conductive layer 46 are patterned into a gate electrode 50 for the MOSFET devices, as shown in FIGS. 2 and 3 for p-channel MOSFET device 54. Thus, the p-channel MOSFET device 54 has source and drain regions 60, 62. Further, the device 54 is electrically isolated by the dielectric material 38 disposed about the periphery of such device 54. It is also noted that the sidewall portions 34 are not covered with the silicon nitride layer 36. It is noted that, and referring to FIG. 1I, a n-MOSFET device 60 is provided in regions 60 and that such regions are electrically isolated from the regions 30 by trenches having silicon nitride layers 26. Other embodiments are within the spirit and scope of the appended claims.

What is claimed is:

1. A method for forming electrically isolated semiconductor devices in a silicon body, comprising:

forming a trench in a selected region of the body;

depositing a barrier material over sidewalls of the trench;

removing portions of the barrier material from a first sidewall portion of the trench to expose such first sidewall portion of the trench while leaving portions of such barrier material on a second sidewall portion of the trench to form a barrier layer thereon;

depositing a dielectric material in the trench, a portion of dielectric material being deposited on the exposed first sidewall portion of the trench and another portion of such deposited dielectric material being deposited on the barrier material;

annealing the dielectric material in an oxidizing environment to densify such deposited dielectric material, the barrier layer inhibiting oxidation of the said second sidewall portion of the trench; and forming a plurality of the semiconductor devices in the silicon body with such devices being electrically isolated by the dielectric material in the trench.

2. The method recited in claim 1 wherein the step of forming the active devices comprises forming one of the active devices as a p-MOSFET and forming another one of the active devices as a n-MOSFET.

3. The method recited in claim 2 wherein the forming step comprises forming one of the devices as a buried channel device.

4. The method recited in claim 3 wherein the forming step comprises the steps of:

depositing a layer of doped polycrystalline silicon over surface portions of the silicon body; and patterning such doped polycrystalline silicon into gate electrodes for the active devices.

5. The method recited in claim 4 wherein the step of forming the active devices comprises forming one of the active devices as a buried channel device adjacent to the first sidewall portion of the trench.

6. The method recited in claim 1 wherein the step of forming the barrier material comprises forming a barrier material of silicon nitride.

7. The method recited in claim 6 wherein the step of forming the active devices comprises forming one of the active devices as a p-channel MOSFET and forming another one of the active devices is a n-channel MOSFET.

8. The method recited in claim 7 wherein the forming step comprises forming one of the p-channel device as a buried channel device adjacent to the first sidewall portion of the trench.

9. The method recited in claim 8 wherein the forming step comprises the step of depositing a layer of doped polycrystalline silicon over surface portions of the silicon body and patterning such doped polycrystalline silicon layer into gate electrodes for the active devices.

10. The method recited in claim 9 wherein the step of forming the active devices comprises forming one of the active devices as a buried channel device adjacent to the first sidewall portion of the trench.

11. The method recited in claim 10 wherein the step of forming the buried channel MOSFET comprises forming such MOSFET as the p-MOSFET device.

\* \* \* \* \*